(12) United States Patent
Okazaki et al.

(10) Patent No.: US 6,822,988 B1
(45) Date of Patent: Nov. 23, 2004

(54) LASER APPARATUS IN WHICH GAN-BASED COMPOUND SURFACE-EMITTING SEMICONDUCTOR ELEMENT IS EXCITED WITH GAN-BASED COMPOUND SEMICONDUCTOR LASER ELEMENT

(75) Inventors: Yoji Okazaki, Kaisei-machi (JP); Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 348 days.

(21) Appl. No.: 09/659,456

(22) Filed: Sep. 11, 2000

(30) Foreign Application Priority Data

Sep. 10, 1999 (JP) ............................................. 11-257529

(51) Int. Cl.[7] .............................. H01S 3/00; H01S 3/091
(52) U.S. Cl. ......................... 372/38.06; 372/75; 372/50; 372/43; 372/33; 372/34; 372/38.07
(58) Field of Search ........................ 372/75, 50, 38.06, 372/43, 33, 34, 45, 46, 92, 12, 71, 95; 345/89; 257/19

(56) References Cited

U.S. PATENT DOCUMENTS

| | | | |
|---|---|---|---|
| 5,461,637 A | 10/1995 | Mooradian et al. | ........... 372/92 |
| 5,627,853 A | 5/1997 | Mooradian et al. | ........... 372/92 |
| 6,147,364 A | * 11/2000 | Itaya et al. | ................... 257/76 |
| 6,306,672 B1 | * 10/2001 | Kim | .............................. 438/22 |
| 6,359,919 B1 | * 3/2002 | Ishikawa et al. | ............... 372/45 |

OTHER PUBLICATIONS

Takao, Someya et al, "Room Temperature Operation of Blue InGaN VCSELs by Optical Pumping", The Blue Laswer Diode, Springer, Berlin, 1997.

Shuji, Nakamura et al, "InGaN/GaN/AlGaN–Based Laser Diodes Grown on GaN Substrates with a Fundamental Transverse Mode", Jpn. J. Appl Phys. vol 37 (1998) pp. L1020–L1022, Part 2, No. 9A/B. Sep. 15, 1998.

Mark, Kuznetsov, et al, "Design and Characteristics of High–Power (>0.5–WCW) Diode–Pumped Vertical–External–Cavity Surface–Emitting Semicondcutor Lasers with Circular $TEM_{00}$ Beams", IEEE Journal of Selected Topics in Quantum Electronics, vol. 5, No. 3, May/Jun. 1999.

* cited by examiner

Primary Examiner—Jerome Jackson
Assistant Examiner—Joseph Nguyen
(74) Attorney, Agent, or Firm—Sughrue Mion, PLLC

(57) ABSTRACT

A laser apparatus includes a semiconductor laser element having a first active layer made of a GaN-based compound, and emitting first laser light; and a surface-emitting semiconductor element having a second active layer made of a GaN-based compound, being excited with the first laser light, and emitting second laser light. In addition, the surface-emitting semiconductor element may have a first mirror arranged on one side of the second active layer, and a second mirror may be arranged outside the surface-emitting semiconductor element so that the first and second mirrors form a resonator.

22 Claims, 8 Drawing Sheets

F I G . 3
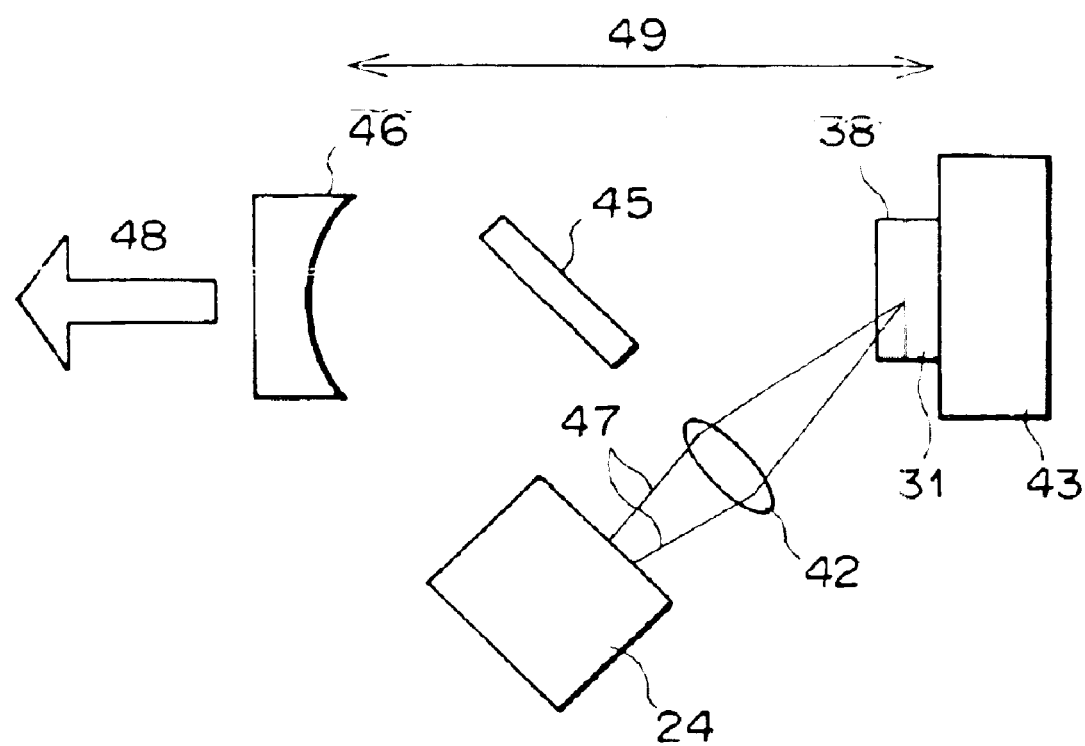

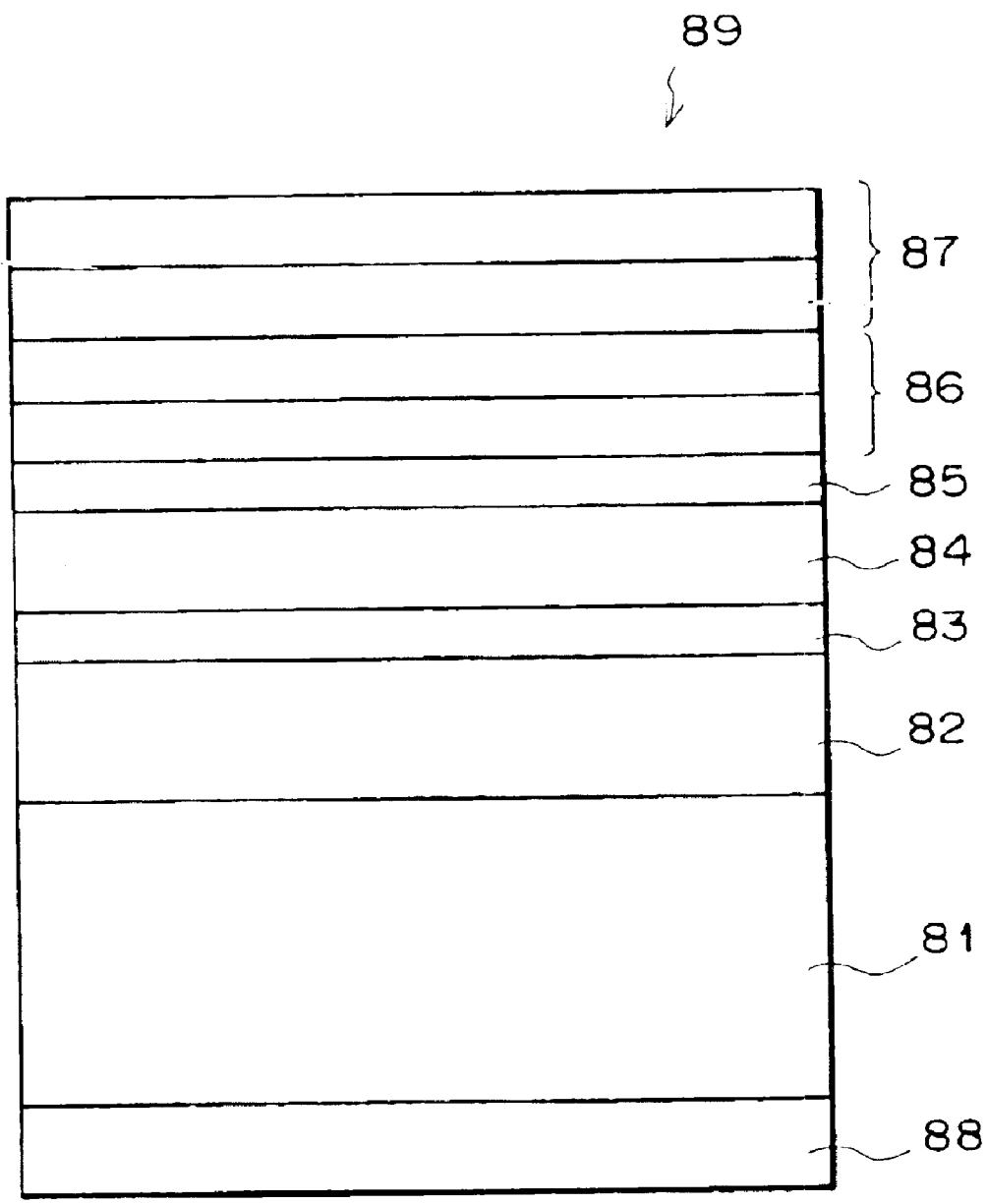

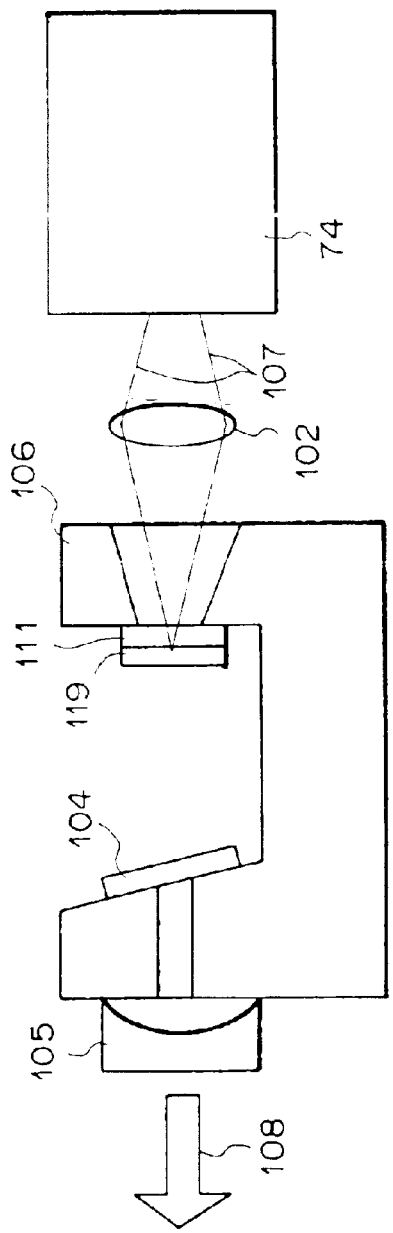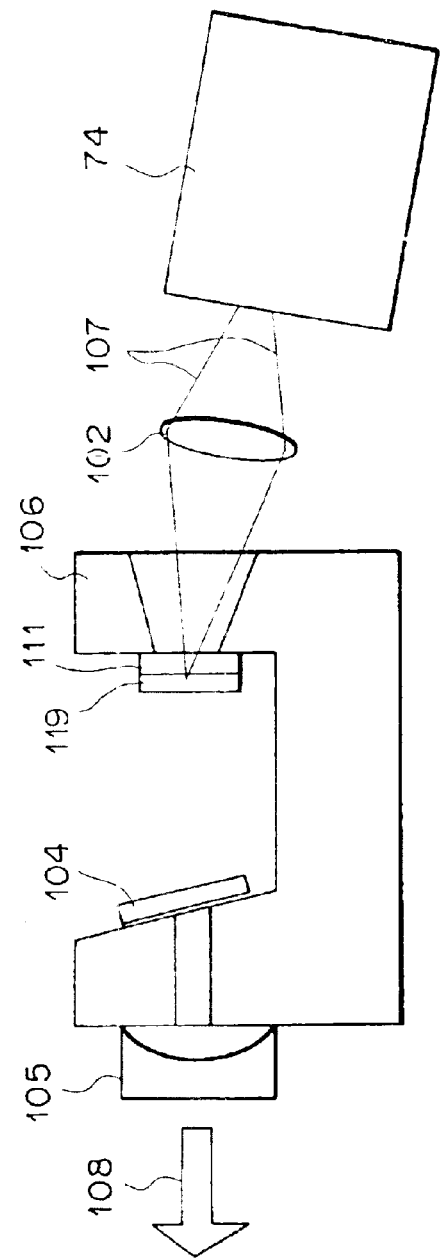
FIG. 8A
FIG. 8B

LASER APPARATUS IN WHICH GAN-BASED COMPOUND SURFACE-EMITTING SEMICONDUCTOR ELEMENT IS EXCITED WITH GAN-BASED COMPOUND SEMICONDUCTOR LASER ELEMENT

BACKGROUND OF THE INVENTION

1. Field of the Invention

The present invention relates to a laser apparatus using a semiconductor laser element.

2. Description of the Related Art

Nakamura et al., "InGaN/GaN/AlGaN-Based Laser Diodes Grown on GaN Substrates with a Fundamental Transverse Mode," Japanese Journal of Applied Physics Part 2 Letters, vol. 37, 1998, pp. L1020 discloses a short-wavelength semiconductor laser device which emits laser light in the 410 nm band. This semiconductor laser device is constructed as follows. First, a GaN substrate is produced by forming a GaN layer on a sapphire substrate, forming a GaN layer by selective growth using a $SiO_2$ mask, and removing the sapphire substrate. Next, an n-type GaN buffer layer, an n-type InGaN crack prevention layer, an AlGaN/n-GaN modulation doped superlattice cladding layer, an n-type GaN optical waveguide layer, an undoped InGaN/n-InGaN multiple-quantum-well active layer, a p-type AlGaN carrier block layer, a p-type GaN optical waveguide layer, an AlGaN/p-GaN modulation doped superlattice cladding layer, and a p-type GaN contact layer are formed on the GaN substrate.

However, the output power of the above semiconductor laser device in the fundamental transverse mode is at most about 30 mW. In addition, current injection type semiconductor laser devices formed as above deteriorate with elapse of time, due to diffusion of dopants such as magnesium and anticipated short-circuit currents. Therefore, it is difficult to increase lifetimes of the current injection type semiconductor laser devices. In particular, when the indium content in the InGaN active layer is increased in order to obtain laser light of a longer wavelength than the green wavelength, the characteristics of the crystal deteriorate, and therefore the lifetime decreases. That is, it is difficult to obtain high output power from the semiconductor laser devices having an indium-rich InGaN active layer.

On the other hand, in the conventional semiconductor-laser excited solid-state laser apparatuses, it is difficult to achieve high speed modulation of laser light by directly modulating semiconductor laser elements which are provided as excitation light sources since the lifetimes of fluorescence emitted from rare earth elements constituting solid-state laser crystals are very long.

In order to solve the above-mentioned problems, U.S. Pat. Nos. 5,461,637 and 5,627,853 propose laser apparatuses in which surface-emitting semiconductor elements are excited with light. However, since these laser apparatuses utilize the thermal lens effect, i.e., the effect of increasing refractive indexes with temperature, the temperature must be raised. In addition, the above laser apparatuses are sensitive to temperature distribution, and the spatial oscillation mode is unstable. The spatial oscillation mode becomes further unstable when output power is high, since a cavity is generated in a carrier distribution due to generation of laser light with high output power (i.e., so-called spatial hole burning occurs), and refractive indexes decrease with increase in the number of carriers due to a so-called plasma effect.

Furthermore, CLEO '99 (Conference on Lasers and Electro-Optics, 1999), post-deadline paper CPD15-1 reports a laser apparatus which emits laser light at the wavelength of 399 nm by exciting an InGaN surface-emitting semiconductor element with a $N_2$ laser as an excitation light source at room temperature. However, this laser apparatus oscillates in a pulse mode having a frequency of 3 Hz, and continuous wave (CW) oscillation is not realized. In addition, since the $N_2$ laser is used, the size and cost of the laser apparatus are great.

As described above, it is very difficult to realize high-output-power oscillation in a fundamental mode in the conventional laser apparatuses which use a semiconductor laser element, and to emit laser light in the wavelength range from ultraviolet to green.

SUMMARY OF THE INVENTION

An object of the present invention is to provide a reliable laser apparatus which oscillates in a fundamental mode with high output power.

According to the first aspect of the present invention, there is provided a laser apparatus comprising: a semiconductor laser element having a am first active layer made of a GaN-based compound, and emitting first laser light; and a surface-emitting semiconductor element having a second active layer made of a GaN-based compound, being excited with the first laser light, and emitting second laser light.

The above surface-emitting semiconductor element may comprise a layered structure formed of a plurality of semiconductor layers made of a plurality of GaN-based compounds, and a pair of mirrors may be arranged on both sides of the layered structure in the direction of the elevation of the semiconductor layers.

According to the second aspect of the present invention, there is provided a laser apparatus comprising: a semiconductor laser element having a first active layer made of a GaN-based compound, and emitting first laser light; a surface-emitting semiconductor element being excited with the first laser light, emitting second laser light, and having a second active layer made of a GaN-based compound and a first mirror arranged on one side of the second active layer; and a second mirror arranged outside the surface-emitting semiconductor element so that the first and second mirrors form a resonator.

The laser apparatuses according to the first and second aspects of the present invention have the following advantages.

(a) Since, according to the present invention, laser light is generated by a GaN-based compound surface-emitting semiconductor element which is excited with excitation laser light emitted by another GaNbased compound semiconductor laser element, the semiconductor laser element which emits the excitation laser light can be a broad area type semiconductor laser element, which can emit laser light having high output power (e.g., 1 to 10 watts). Therefore, laser light of hundreds of milliwatts to several watts can be obtained from the laser apparatus according to the present invention. That is, the laser apparatus according to the present invention can emit laser light with high output power in a fundamental transverse mode.

(b) Since the thermal conductivities of the GaN-based compound semiconductor elements are very great (i.e., about 130 W/m·K), compared with the thermal conductivities of the GaAs-based compound semiconductors, which are about 45.8 W/m·K, the aforementioned thermal lens effect is not caused in the GaN-based compound semiconductor elements. In addition, when an external mirror is provided; i.e., the aforementioned second mirror is provided outside the surface-emitting semiconductor element, laser oscillation can be achieved without using the thermal lens effect. Therefore, the oscillation mode is stable.

(c) Since a semiconductor laser element is used as an excitation light source, it is possible to realize a laser apparatus which is highly efficient, inexpensive, and capable of achieving the continuous wave (CW) oscillation.

(d) Since the surface-emitting semiconductor element can be directly modulated, it is possible to achieve high-speed modulation of laser light in the wavelength range from ultraviolet to green.

(e) The surface-emitting semiconductor elements used in the laser apparatuses according to the first and second aspects of the present invention are excited with light, and are therefore different from the usual semiconductor laser elements driven by current injection, in that the light-excited surface-emitting semiconductor elements are free from the aforementioned problem of the deterioration with elapse of time due to short-circuit currents caused by diffusion of dopants such as magnesium. Thus, the lifetimes of the laser apparatuses according to the first and second aspects of the present invention are long.

Preferably, the laser apparatuses according to the first and second aspects of the present invention may also have one or any possible combination of the following additional features (i) to (v).

(i) The first active layer may be made of an InGaN or GaN material, and the second active layer may be made of an InGaN material.

(ii) The first active layer may be made of an InGaN or GaN material, and the second active layer may be made of a GaNAs or InGaNAs material.

(iii) The laser apparatus according to the first or second aspect of the present invention may further comprise at least one third semiconductor laser element each of which has a third active layer made of a GaN-based compound, and emits third laser light, and the surface-emitting semiconductor element may be excited with the third laser light together with the first laser light.

(iv) The laser apparatus according to the first or second aspect of the present invention may further comprise at least one third semiconductor laser element each of which has a third active layer made of a GaN-based compound, and emits third laser light, and the surface-emitting semiconductor element may be excited with fourth laser light which is produced by polarization coupling of the first and third laser light.

(v) The second active layer may include a plurality of quantum wells. In particular, it is preferable that the number of quantum wells included in the second active layer is twenty or more.

DESCRIPTION OF THE DRAWINGS

FIG. 3 is a diagram illustrating the construction of the laser apparatus as the first embodiment of the present invention.

FIG. 5 is a crosssectional view of a surface-emitting semiconductor element which is also used in the laser apparatus as the second embodiment of the present invention.

FIG. 8A is a diagram illustrating the construction of the laser apparatus as the third embodiment of the present invention.

FIG. 8B is a diagram illustrating the construction of the laser apparatus as a variation of the third embodiment of the present invention.

DESCRIPTION OF PREFERRED EMBODIMENTS

Embodiments of the present invention are explained in detail below with reference to drawings.

First Embodiment

Figure 1:
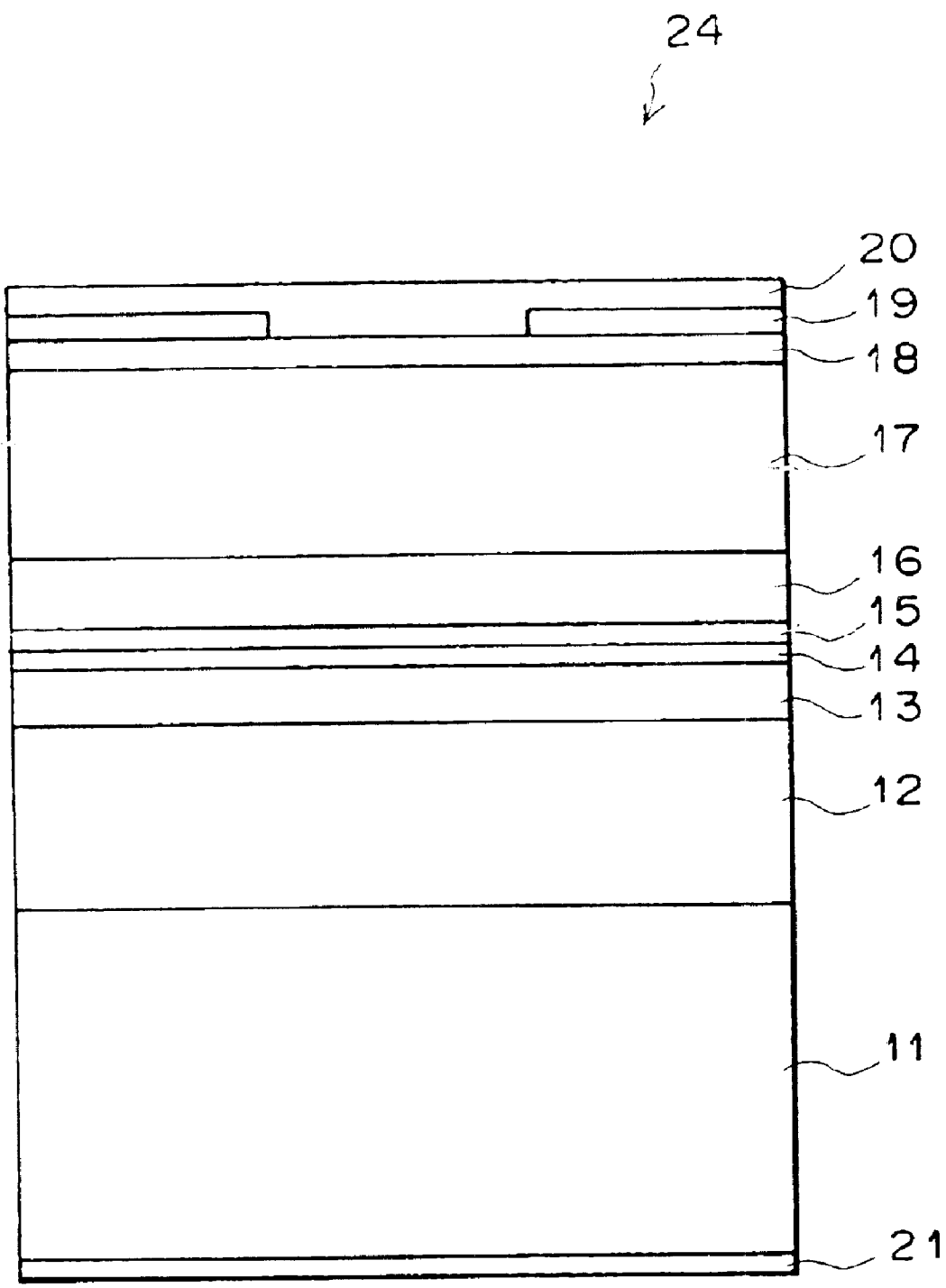
FIG. 1 is a crosssectional view of a semiconductor laser element which is used as an excitation light source in a laser apparatus as the first embodiment of the present invention.

The semiconductor laser element used as an excitation light source in the first embodiment emits laser light in the 360 nm band as excitation light. FIG. 1 is a crosssectional view of the semiconductor laser. The semiconductor laser element used as an excitation light source in the first embodiment is produced as follows.

Initially, an n-type GaN (0001) substrate 11 is formed in accordance with the method described in Japanese Journal of Applied Physics Part 2 Letters, vol. 37, 1998, pp. L1020. Then, an n-type $Ga_{1-z1}Al_{z1}N/GaN$ superlattice cladding layer 12 ($0<z1<1$), an n-type or i-type (intrinsic) $Ga_{1-z2}Al_{z2}N$ optical waveguide layer 13 ($z1>z2>0$), a $Ga_{1-z2}Al_{z2}N$ (doped with Si)/GaN multiple-quantum-well active layer 14, a p-type $Ga_{1-z3}Al_{z3}N$ carrier a blocking layer 15 ($0.5>z3>z2$), an n-type or i-type $Ga_{1-z2}Al_{z2}N$ optical waveguide layer 16 ($z1>z_{2>0}$), a p-type $Ga_{1-z1}Al_{z1}N/GaN$ superlattice cladding layer 17 ($0<z1<l$), and a p-type GaN contact layer 18 are formed on the n-type GaN (0001) substrate 11 by organometallic vapor phase epitaxy. Thereafter, a $SiO_2$ insulation film 19 is formed over the p-type GaN contact layer 18, and a stripe area of the $SiO_2$ insulation film 19 having a width of about 100 $\mu m$ is removed by normal lithography. Then, a p electrode 20 is formed over the $SiO_2$ insulation film 19 and the stripe area of the p-type GaN contact layer 18, the substrate 11 is polished, and an n electrode 21 is formed on the polished surface of the substrate 11. Finally, a resonator is formed by cleavage, and a high reflectance coating and a low reflectance coating are provided on the respective end surfaces so as to form a resonator. Then, the construction of FIG. 1 is formed into a chip.

Figure 2:
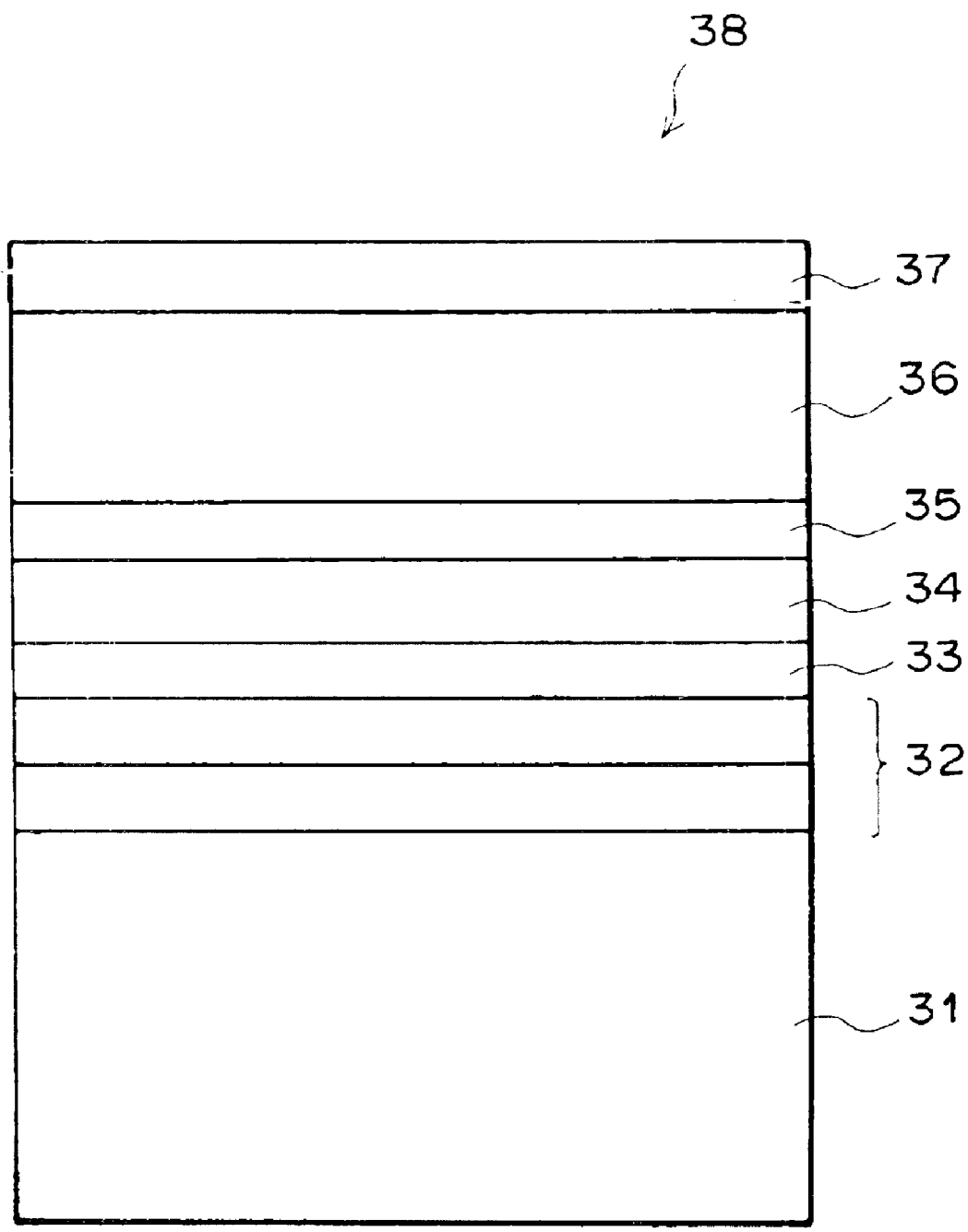
FIG. 2 is a crosssectional view of a surface-emitting semiconductor element which is also used in the laser apparatus as the first embodiment of the present invention.

FIG. 2 is a crosssectional view of a surface-emitting semiconductor element which is also used in the laser apparatus as the first embodiment of the present invention. The surface-emitting semiconductor element of FIG. 2 is excited with excitation laser light emitted from the semiconductor laser element of FIG. 1, and oscillates in a single transverse mode. The surface-emitting semiconductor element used in the first embodiment is produced as follows.

Initially, a superlattice distributed reflection film 32, a GaN optical confinement layer 33, an $In_{x2}Ga_{1-x2}N/In_{x3}Ga_{1-x3}N$ multiple-quantum-well active layer 34 (0<x2<x3<0.5), a GaN optical confinement layer 35, and an $Al_{z4}Ga_{1-z4}N$ layer 36 (0<z4<0.5) are formed on a GaN (0001) substrate 31 by organometallic vapor phase epitaxy, where the superlattice distributed reflection film 32 is comprised of 20 pairs of AlN and GaN layers, the GaN layer in each pair has a thickness of $\lambda/4n_{GaN}$, the AlN layer in each pair has a thickness of $\lambda/4n_{AlN}$, $\lambda$ is an oscillation wavelength of the surface-emitting semiconductor element of FIG. 2, and $n_{GaN}$ and $n_{AlN}$ are the refractive indexes of GaN and AlN at the oscillation wavelength $\lambda$, respectively. Next, a $ZrO_2$ antireflection coating 37 having a thickness of $\lambda/4n_{ZrO2}$ is formed over the construction layered as above, by electron beam evaporation, where $n_{ZrO2}$ is the refractive index of $ZrO_2$ at the oscillation wavelength $\lambda$. Thereafter, the substrate 31 is polished, and the layered structure formed as above is cleaved, and further, formed into a chip.

The wavelength $\lambda$ of light emitted by the surface-emitting semiconductor element 38 of FIG. 2 can be controlled in the range between 380 and 560 nm by appropriately adjusting the composition of the $In_{x3}Ga_{1-x3}N$ multiple-quantum-well active layer 34.

In order to sufficiently absorb the excitation laser light, it is preferable that the number of quantum wells in the multiple-quantum-well active layer 34 is 20 or more, and it is further preferable that the number of quantum wells is about 24 since the surface-emitting semiconductor element 38 is prone to crack due to excessive thickness when the number of quantum wells exceeds 24.

FIG. 3 is a diagram illustrating the construction of the laser apparatus as the first embodiment of the present invention.

The laser apparatus of FIG. 3 comprises the semiconductor laser element 24 as the excitation light source, the surface-emitting semiconductor element 38 bonded to a heatsink 43 at the surface of the substrate 31, a concave mirror 46 as an output mirror, a resonator 49 formed by a concave surface of the concave mirror 46 and the superlattice distributed reflection film 32 of the surface-emitting semiconductor element 38, and a Brewster plate 45 arranged in the resonator 49. The Brewster plate 45 controls polarization.

In the construction of FIG. 3, excitation laser light 47 emitted from the semiconductor laser element 24 is collected by the lens 42 into the semiconductor layers of the surface-emitting semiconductor element 38, and excites the surface-emitting semiconductor element 38. Then, light emitted by the surface-emitting semiconductor element 38 resonates in the resonator 49, and laser light 48 exits from the output mirror 46.

Since the GaN substrate 31 of the surface-emitting semiconductor element 38 is not transparent to the excitation laser light 47 emitted from the semiconductor laser element 24, the surface-emitting semiconductor element 38 is excited with the excitation laser light 47 from the lateral side of the surface-emitting semiconductor element 38, as illustrated in FIG. 3.

The laser apparatus of FIG. 3 has the following advantages.

(a) Since the thermal conductivity of the GaN substrate 31 is great, heat dissipation of the surface-emitting semiconductor element 38 is easy when the surface-emitting semiconductor element 38 is bonded to the heatsink 43 at the surface of the GaN substrate 31 as illustrated in FIG. 3. In addition, beam deformation due to the thermal lens effect is very small in surface-emitting semiconductor elements. Therefore, the laser apparatus of FIG. 3 can achieve higher output power than the conventional laser apparatuses using semiconductor laser elements.

(b) High speed modulation of the output laser light of the laser apparatus of FIG. 3 can be achieved by directly modulating the semiconductor laser element 24, while high speed modulation is difficult in the conventional solid-state laser.

(c) Since the semiconductor laser element 24 can be a broad area type semiconductor laser element as described with reference to FIG. 1, the semiconductor laser element 24 can emit laser light with high output power (e.g., 1 to 10 watts). Therefore, the output power of the laser apparatus of FIG. 3 can be hundreds of milliwatts to several watts.

(d) The surface-emitting semiconductor element 38 is excited with light, and is therefore different from the usual semiconductor laser elements driven by current injection, in that the surface-emitting semiconductor element 38 is free from the aforementioned problem of deterioration with elapse of time due to short-circuit currents caused by diffusion of dopants such as magnesium. Thus, the lifetime of the laser apparatus of FIG. 3 is long.

Second Embodiment

Figure 4:
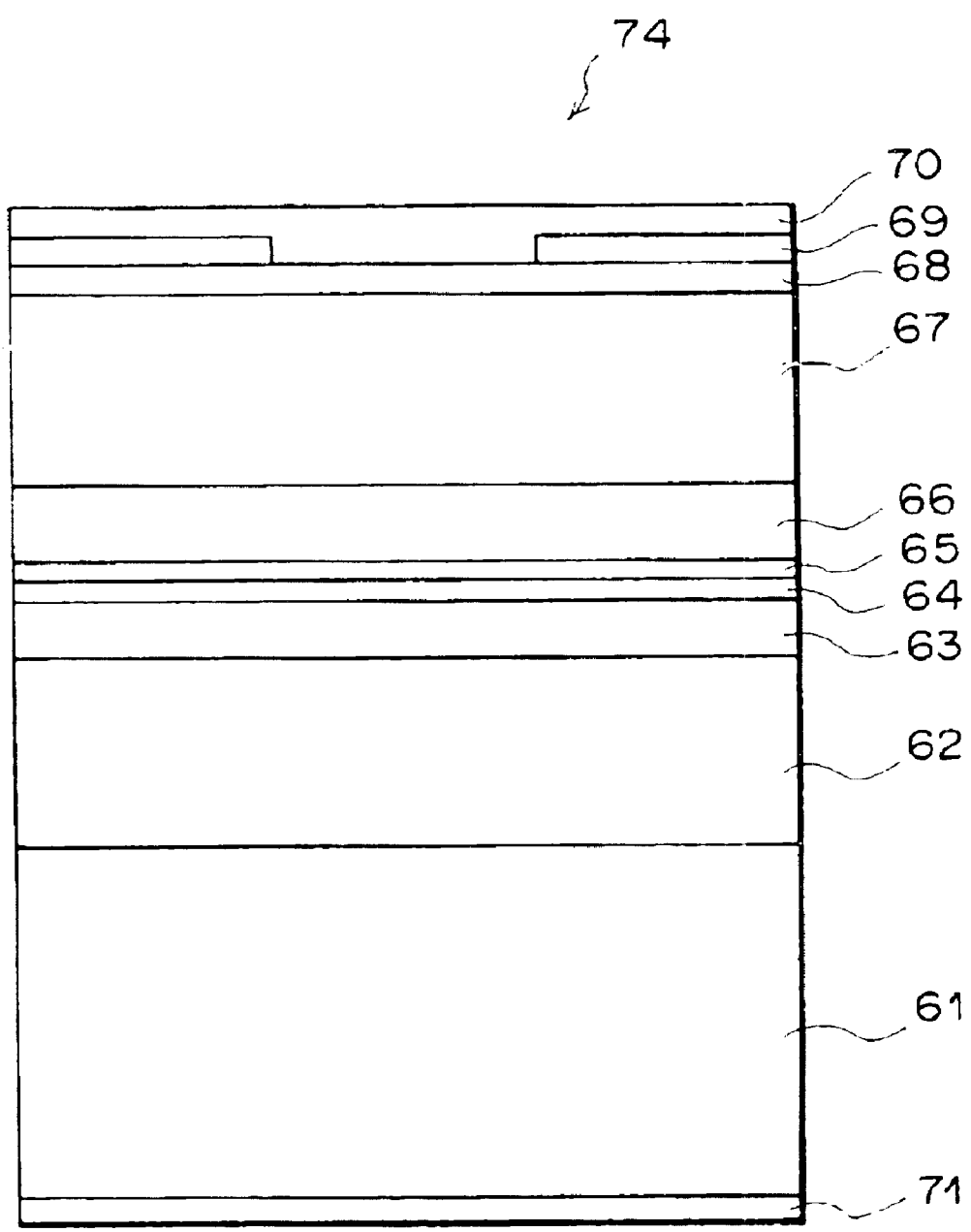
FIG. 4 is a crosssectional view of a semiconductor laser element which is used as an excitation light source in a laser apparatus as the second embodiment of the present invention.

The semiconductor laser element used as an excitation light source in the second embodiment emits laser light in the 410 nm band as excitation light. FIG. 4 is a crosssectional view of the semiconductor laser. The semiconductor laser element used as an excitation light source in the second embodiment is produced as follows.

Initially, an n-type $Ga_{1-z1}Al_{z1}N/GaN$ superlattice cladding layer 62 (0<z1<1), an n-type or i-type GaN optical waveguide layer 63, an $In_{1-z2}Ga_{z2}N$ (doped with Si)/$In_{1-z3}N$ multiple-quantum-well active layer 64 (0<z2<z3<0.5), a p-type $Ga_{1-z5}N$ carrier blocking layer 65 (0<z5<0.5), an n-type or i-type GaN optical waveguide layer 66, a p-type $Ga_{1-z1}Al_{z1}N/GaN$ superlattice cladding layer 67 (0<z1<1), and a p-type GaN contact layer 68 are formed on an n-type GaN (0001) substrate 61 by organometallic vapor phase epitaxy. Thereafter, a $SiO_2$ insulation film 69 is formed over the p-type GaN contact layer 68, and a stripe area of the $SiO_2$ insulation film 69 having a width of about 100 μm is removed by normal lithography. Then, a p electrode 70 is formed over the $SiO_2$ insulation film 69 and the stripe area of the p-type GaN contact layer 68, the substrate 61 is polished, and an, n electrode 71 is formed on the polished surface. Finally, a resonator is formed by cleavage, and a high reflectance coating and a low reflectance coating are provided on the respective end surfaces so as to form a resonator. Then, the construction of FIG. 4 is formed into a chip.

FIG. 5 is a crosssectional view of a surface-emitting semiconductor element which is also used in the laser apparatus as the second embodiment of the present invention. The surface-emitting semiconductor element of FIG. 5 is excited with excitation laser light emitted from the semiconductor laser element of FIG. 4, and oscillates in a single transverse mode. The surface-emitting semiconductor element used in the second embodiment is produced as follows.

Initially, an $Al_{z4}Ga_{1-z4}N$ layer 82 (0<z4<0.5), a GaN optical confinement layer 83, an $In_{1-z2}Ga_{z2}N/In_{1-z3}Ga_{z3}N$ multiple-quantum-well active layer 84 (0<z2<z3<0.5), a GaN optical confinement layer 85, and a superlattice distributed reflection film 86 are formed on a GaN (0001)

substrate 81 by organometallic vapor phase epitaxy, where the reflection film 86 is comprised of two pairs of an AlN and GaN layers, the AlN layer in each pair has a thickness of $\lambda/4n_{AlN}$, the GaN layer in each pair has a thickness of $\lambda/4n_{GaN}$, $\lambda$ is an oscillation wavelength of the surface-emitting semiconductor element of FIG. 5, and $n_{AlN}$ and $n_{GaN}$ are the refractive indexes of AlN and GaN at the oscillation wavelength $\lambda$, respectively. Next, a distributed reflection film 87 is formed over the construction layered as above, by electron beam evaporation, where the distributed reflection film 87 is comprised of at least one pair of $SiO_2$ and $ZrO_2$ layers, the $SiO_2$ layer in each pair has a thickness of $\lambda/4n_{SiO2}$, the $ZrO_2$ layer in each pair has a thickness of $\lambda/4n_{ZrO2}$, $\lambda$ is an oscillation wavelength of the surface-emitting semiconductor element of FIG. 5, and $n_{SiO2}$ and $n_{ZrO2}$ are the refractive indexes of $SiO_2$ and $ZrO_2$ at the oscillation wavelength $\lambda$, respectively. Thereafter, the substrate 81 is polished, and a $ZrO_2$ antireflection coating 88 having a thickness of $\lambda/4n_{ZrO2}$ is provided on the polished surface of the substrate 81. Finally, the layered structure formed as above is cleaved, and further formed into a chip.

In order to sufficiently absorb the excitation laser light, it is preferable that the number of quantum wells in the multiple-quantum-well active layer 84 is 20 or more, and it is further preferable that the number of the quantum wells is about 24 since the surface-emitting semiconductor element 89 is prone to crack due to excessive thickness when the number of the quantum wells exceeds 24.

The wavelength $\lambda$ of light emitted from the semiconductor laser element 89 of FIG. 5 can be controlled in the range between 380 and 560 nm by appropriately adjusting the composition of the $In_{z3}Ga_{1-z3}N$ multiple-quantum-well active layer 84.

Figure 6A:
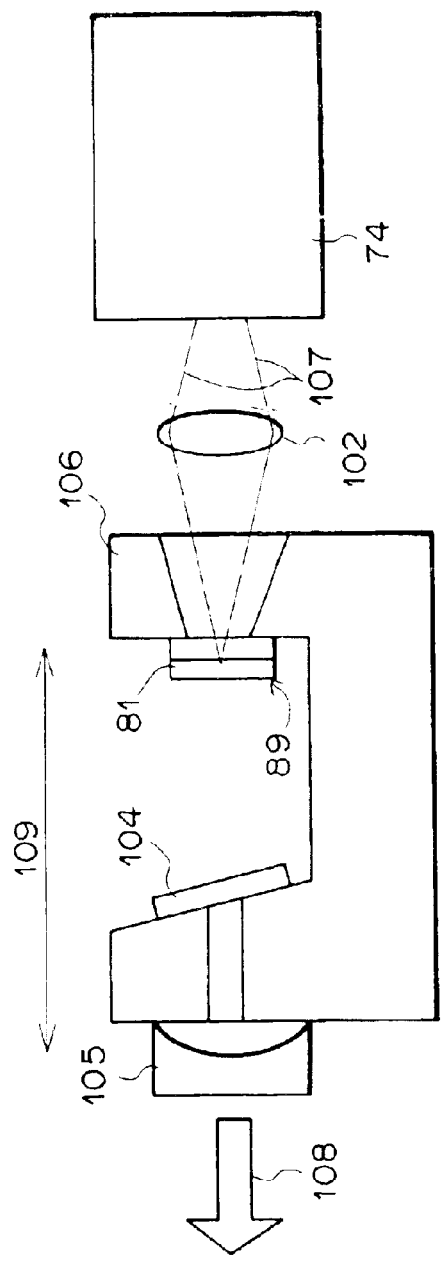
FIG. 6A is a diagram illustrating the construction of the laser apparatus as the second embodiment of the present invention.

FIG. 6A is a diagram illustrating the construction of the laser apparatus as the second embodiment of the present invention.

The laser apparatus of FIG. 6A comprises the semiconductor laser element 74 as an excitation light source, the surface-emitting semiconductor element 89 bonded to a heatsink 106 at the surface of the distributed reflection film 87, a concave mirror 105 as an output mirror, a resonator 109 formed by the concave surface of the concave mirror 105 and a reflection mirror realized by the reflection films 86 and 87 of the surface-emitting semiconductor element 89, and a Brewster plate 104 arranged in the resonator 109.

In the construction of FIG. 6A, excitation laser light 107 emitted from the semiconductor laser element 74 is collected by the lens 102 into the semiconductor layers of the surface-emitting semiconductor element 89, and excites the surface-emitting semiconductor element 89. Then, light emitted by the surface-emitting semiconductor element 89 resonates in the resonator 109, and laser light 108 exits from the output mirror 105.

In the laser apparatus of FIG. 46A, the surface-emitting semiconductor element 89 is bonded to the heatsink 106 at the surface of the distributed reflection film 87, which is an end surface of the surface-emitting semiconductor element which is near to the active layer. Therefore, heat generated in the active layer can be easily dissipated into the heatsink 106, and thus the laser apparatus of FIG. 6A can emit laser light in a stable oscillation mode.

Figure 6B:
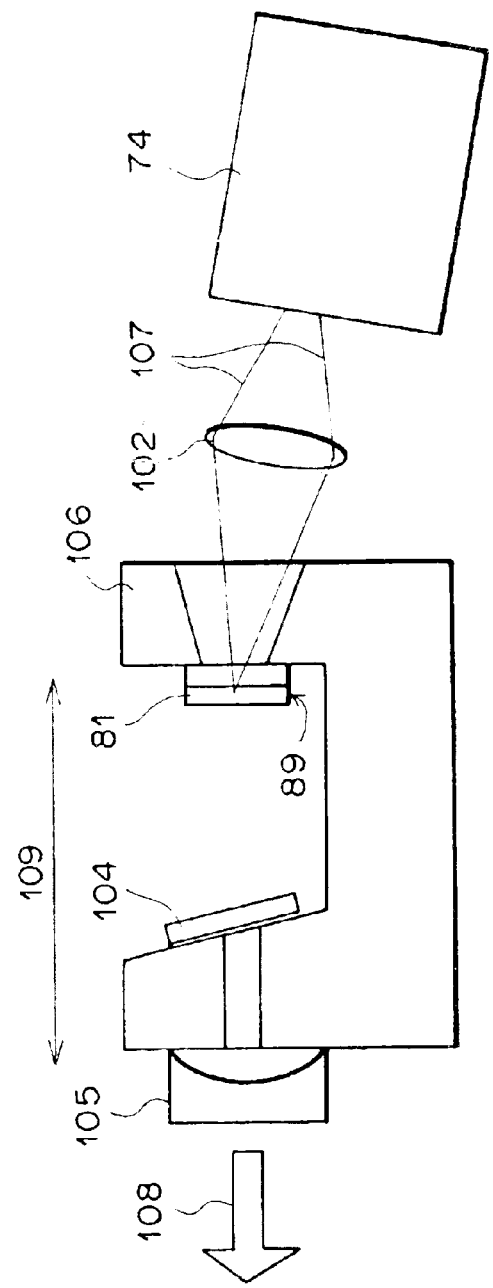
FIG. 6B is a diagram illustrating the construction of the laser apparatus as a variation of the second embodiment of the present invention.

Alternatively, the incident direction of the excitation laser light 107 from the semiconductor laser element 74 may be inclined as illustrated in FIG. 6B so as to suppress light returned from the resonator 109 to the semiconductor laser element 74.

Third Embodiment

Figure 7:
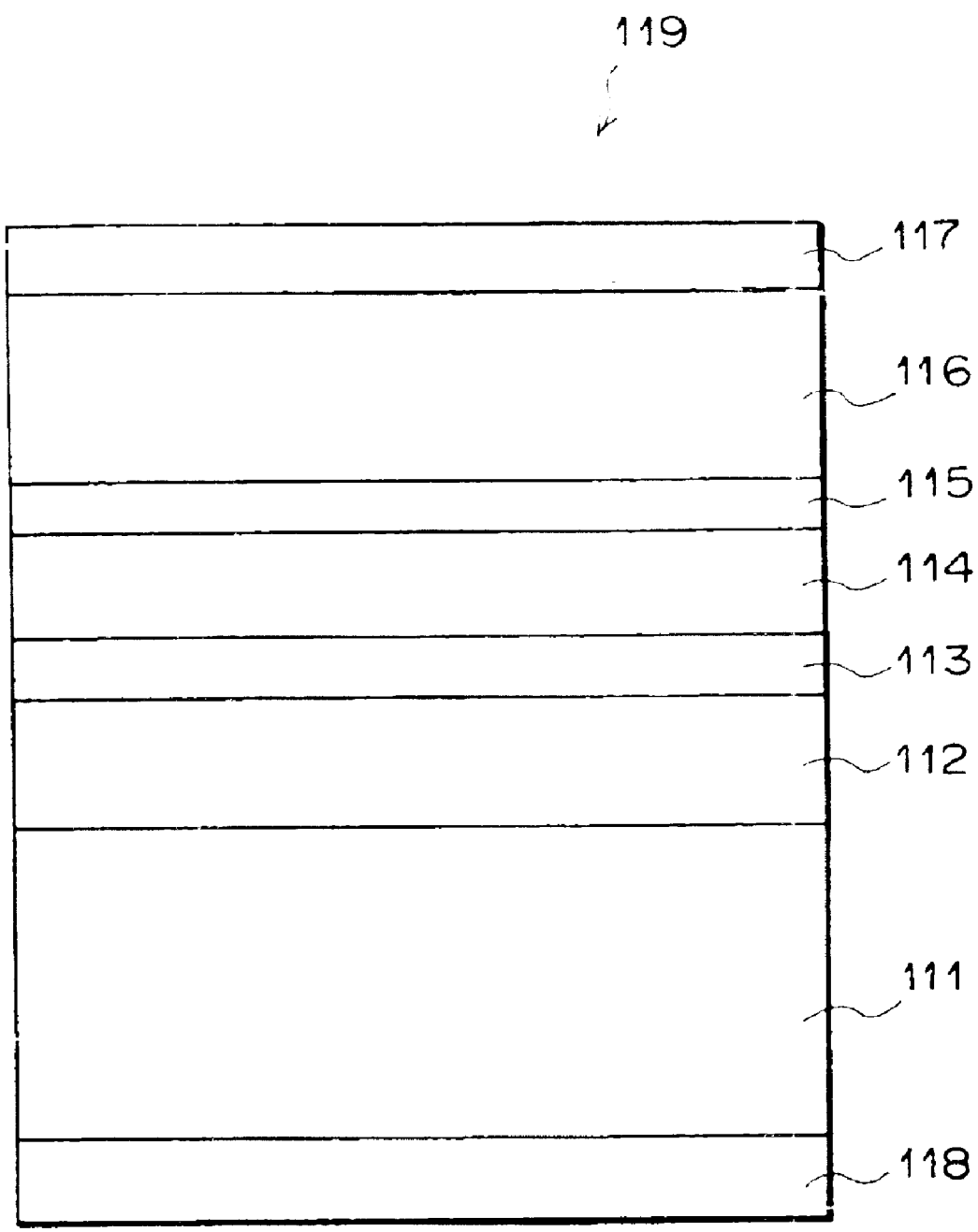
FIG. 7 is a crosssectional view of a surface-emitting semiconductor element in a laser apparatus as the third embodiment of the present invention.

FIG. 7 is a crosssectional view of a surface-emitting semiconductor element which is used in the laser apparatus as the third embodiment of the present invention. The surface-emitting semiconductor element of FIG. 7 is excited with excitation laser light emitted from the semiconductor laser element of FIG. 4, and oscillates in a single transverse mode. The surface-emitting semiconductor element used in the third embodiment is produced as follows.

Initially, a superlattice distributed reflection film 112, a GaN optical confinement layer 113, an $In_{1-z2}Ga_{z2}N/In_{1-z3}Ga_{z3}N$ multiple-quantum-well active layer 114 (021 z2<z3<0.5), a GaN optical confinement layer 115, an $Al_{z4}Ga_{1-z4}N$ carrier confinement layer 116 (0<z4<0.5), and a $ZrO_2$ layer 117 are formed on a GaN (0001) substrate 111 by organometallic vapor phase epitaxy. The superlattice distributed reflection film 112 is comprised of two pairs of an AlN and GaN layers, the AlN layer in each pair has a thickness of $\lambda/4n_{AlN}$, the GaN layer in each pair has a thickness of $\lambda/4n_{GaN}$, $\lambda$ is an oscillation wavelength of the surface-emitting semiconductor element of FIG. 7, and $n_{AlN}$ and $n_{GaN}$, are the refractive indexes of GaN and AlN at the oscillation wavelength $\lambda$, respectively. In addition, the $ZrO_2$ layer 117 has a thickness of $\lambda/4n_{ZrO2}$, where $n_{ZrO2}$ is the refractive index of $ZrO_2$ at the oscillation wavelength $\lambda$. Next, the substrate 111 is polished, and a $ZrO_2$ antireflection coating 118 having a thickness of $\lambda/4_{ZrO2}$ is formed on the polished surface of the substrate 111. Thereafter, the layered structure formed as above is cleaved, and further formed into a chip.

In order to sufficiently absorb the excitation laser light, it is preferable that the number of quantum wells in the multiple-quantum-well active layer 114 is 20 or more, and it is further preferable that the number of the quantum wells is about 24 since the surface-emitting semiconductor element 118 is prone to crack due to excessive thickness when the number of the quantum wells exceeds 24.

The constructions of two examples of laser apparatuses as the third embodiment are illustrated in FIGS. 8A and 8B. In the constructions of FIGS. 8A and 8B, the surface-emitting semiconductor element 118 of FIG. 7 is excited with excitation laser light emitted from the semiconductor laser element 74, which is illustrated in FIG. 5. The constructions of FIGS. 8A and 8B are respectively identical with the constructions of FIGS. 6A and 6B, except that the surface-emitting semiconductor element 119 has the construction of FIG. 7, and the surface-emitting semiconductor element 119 is bonded to the heatsink 106 at the surface of the GaN substrate 111.

Since the GaN substrate 111 is transparent to the excitation laser light 107, it is possible to excite the surface-emitting semiconductor element 119 through the GaN substrate 111. Alternatively, when a sapphire substrate is used, instead of the GaN substrate, excitation laser light can also be supplied to the surface-emitting semiconductor element through the sapphire substrate since the sapphire substrate is also transparent to the excitation laser light.

In addition, since the thermal conductivity of the GaN substrate is great, heat generated in the surface-emitting semiconductor element can be easily dissipated into the heatsink when the surface-emitting semiconductor element is bonded to the heatsink as illustrated in FIG. 8A or 8B. Further, beam deformation due to the thermal lens effect or the like is very small.

Additional Matters (i) One or more wavelength selection elements such as Lyot filters or etalons may be further arranged in the resonator in each of the first to third embodiments so as to realize oscillation in a single longitudinal mode.

(ii) The active layer of the surface-emitting semiconductor element in each embodiment may be made of a GaNAs or InGaNAs material, instead of InGaN materials, so as to enable oscillation at a longer wavelength.

(iii) The semiconductor laser elements for emitting excitation laser light in the first to third embodiments are not limited to the broad-area type, and may be α-DFB (distributed feedback) semiconductor lasers, MOPA (master oscillator power amplifier) semiconductor lasers, or other normal semiconductor lasers. In particular, the MOPA semiconductor lasers, which have a tapered structure, enable high-density light collection.

(iv) The laser apparatuses according to the present invention can operate not only in a continuous wave (CW) mode, but also in a Q-switched mode.

(v) Since it is easy to obtain high peak power from the InGaN semiconductor laser elements, and the excitation light source in each of the first to third embodiments is realized by the InGaN semiconductor laser element, it is also easy to obtain pulsed light having high peaks by driving the InGaN semiconductor laser element in a pulse mode, and exciting the surface-emitting semiconductor element with the InGaN semiconductor laser element.

(vi) In addition, all of the contents of Japanese Patent Application No. 11(1999)-257529 are incorporated into this specification by reference.

What is claimed is:

1. A laser apparatus comprising:
    a semiconductor laser element having a first active layer made of a GaN-based compound, and emitting first laser light; and
    a surface-emitting semiconductor element having a second active layer made of a GaN-based compound, being excited with said first laser light, and emitting second laser light.

2. A laser apparatus according to claim 1, wherein said second active layer includes a plurality of quantum wells.

3. A laser apparatus according to claim 2, wherein said second active layer includes twenty or more quantum wells.

4. A laser apparatus according to claim 1, wherein said first active layer is made of an InGaN or GaN material, and said second active layer is made of an InGaN material.

5. A laser apparatus according to claim 4, wherein said second active layer includes a plurality of quantum wells.

6. A laser apparatus according to claim 5, wherein said second active layer includes twenty or more quantum wells.

7. A laser apparatus according to claim 1, wherein said first active layer is made of an InGaN or GaN material, and said second active layer is made of a GaNAs or InGaNAs material.

8. A laser apparatus according to claim 7, wherein said second active layer includes a plurality of quantum wells.

9. A laser apparatus according to claim 8, wherein said second active layer includes twenty or more quantum wells.

10. A laser apparatus according to claim 1, wherein the semiconductor laser element is a broad area type semiconductor laser element having output power substantially in a range of 1 to 10 watts and the laser apparatus generates output power up to several watts in a stable fundamental transverse mode.

11. A laser apparatus according to claim 1, wherein the GaN-based compound in the first active layer of the semiconductor laser element is an InGaN material for emitting an excitation light in the 410 nm band, the surface-emitting semiconductor element further comprises a GaN substrate, and the first laser light is supplied to the surface-emitting semiconductor laser element through the GaN substrate.

12. A laser apparatus comprising:
    a semiconductor laser element having a first active layer made of a GaN-based compound, and emitting first laser light;
    a surface-emitting semiconductor element being excited with said first laser light, emits second laser light, and having a second active layer made of a GaN-based compound and a first mirror arranged on one side of said second active layer; and
    a second mirror arranged outside said surface-emitting semiconductor element so that said first and second mirrors form a resonator.

13. A laser apparatus according to claim 12, wherein said second active layer includes a plurality of quantum wells.

14. A laser apparatus according to claim 13, wherein said second active layer includes twenty or more quantum wells.

15. A laser apparatus according to claim 12, wherein said first active layer is made of an InGaN or GaN material, and said second active layer is made of an InGaN material.

16. A laser apparatus according to claim 15, wherein said second active layer includes a plurality of quantum wells.

17. A laser apparatus according to claim 16, wherein said second active layer includes twenty or more quantum wells.

18. A laser apparatus according to claim 12, wherein said first active layer is made of an InGaN or GaN material, and said second active layer is made of a GaNAs or InGaNAs material.

19. A laser apparatus according to claim 18, wherein said second active layer includes a plurality of quantum wells.

20. A laser apparatus according to claim 19, wherein said second active layer includes twenty or more quantum wells.

21. A laser apparatus according to claim 12, wherein the semiconductor laser element is a broad area type semiconductor laser element having output power substantially in a range of 1 to 10 watts and the laser apparatus generates output power up to several watts in a stable fundamental transverse mode.

22. A laser apparatus according to claim 12, wherein the GaN-based compound in the first active layer of the semiconductor laser element is an InGaN material for emitting an excitation light in the 410 nm band, the surface-emitting semiconductor element further comprises a GaN substrate, and the first laser light is supplied to the surface-emitting semiconductor laser element through the GaN substrate.

* * * * *